(12) United States Patent
Tung et al.

(10) Patent No.: US 6,269,005 B1
(45) Date of Patent: Jul. 31, 2001

(54) PCMCIA CONNECTOR

(75) Inventors: Shun-Chi Tung, Tu-Chen; Hung-Chi Yu, Hsi-Chih, both of (TW)

(73) Assignee: Hon Hai Precision Ind. Co., Ltd., Tzipei Hsien (TW)

( * ) Notice: Subject to any disclaimer, the term of this patent is extended or adjusted under 35 U.S.C. 154(b) by 0 days.

(21) Appl. No.: 09/346,117

(22) Filed: Jul. 1, 1999

(30) Foreign Application Priority Data

Dec. 28, 1998 (TW) .................................. 87221640

(51) Int. Cl.$^7$ ..................................... H05K 1/14
(52) U.S. Cl. .................. 361/737; 361/741; 361/802; 439/138; 439/148
(58) Field of Search ............... 361/737, 740, 361/741, 747, 752, 756, 759, 801, 802; 439/136, 138, 142, 148, 541.5

(56) References Cited

U.S. PATENT DOCUMENTS

| 5,537,293 | * | 7/1996 | Kobayashi et al. | .................. 361/737 |
| 5,662,482 | * | 9/1997 | Shin | ..................... 439/642 |
| 5,716,221 | * | 2/1998 | Kantner | .................. 439/64 |

* cited by examiner

Primary Examiner—Jeffrey Gaffin
Assistant Examiner—Phuong T. Vu
(74) Attorney, Agent, or Firm—Wei Te Chung

(57) ABSTRACT

A PCMCIA connector includes an insulative header retaining contact elements therein and a shielding casing having a top panel attached to the header. The shielding casing has two side panels extending from the top panel for defining a primary space adapted to receive a type I or type II PCMCIA card. A raised section is formed on the top panel and has a top wall located above the top panel. Two side walls extend from the top wall and are connected to the top panel thereby defining a secondary space in communication with and substantially continuous with the primary space whereby the primary and secondary spaces together can accommodate a type III PCMCIA card. A dummy card is selectively received in the secondary space without interfering with insertion of the type I or type II PCMCIA card into the primary space. The dummy card includes a flat body receivable in the secondary space and defines a recess in which a panel is pivotally supported for selectively shielding the primary and secondary spaces. The flat body has two resilient arms each forming a projection for engaging with a hole defined in a corresponding side wall of the raised section thereby retaining the dummy card in the secondary space.

5 Claims, 6 Drawing Sheets

Type I

Type II

Type III

PCMCIA CONNECTOR

BACKGROUND OF THE INVENTION

1. Field of the Invention

The present invention generally relates to a Personal Computer Memory Card International Association (PCMCIA) connector, and in particular to a PCMCIA connector having a dust shielding member for preventing dust from entering into the connector.

2. The Prior Art

PCMCIA cards have been widely used for expanding resources of a computer. Examples of PCMCIA cards are disclosed in Taiwan Patent Application No. 82211048 and U.S. Pat. Nos. 5,519,577 and 5,546,278. Three types of PCMCIA cards are available in the market, namely type I, type II and type III. FIGS. 1A and 1B of the attached drawings show a type I PCMCIA card which has a uniform thickness (h) of 3.3 mm. FIGS. 2A and 2B show a type II PCMCIA card which has a central raised portion with a thickness (H) of 5.0 mm and two thin edges with a thickness (h) of 3.3 mm. A type III PCMCIA card is shown in FIGS. 3A and 3B and includes a hard disk drive (HDD) and a central raised portion with a thickness (H) of 10.5 mm and two thin edges with a thickness (h) of 3.3 mm.

All three types have edges of 3.3 mm receivable in guide channels of a PCMCIA connector. However, for a PCMCIA connector to accommodate all three types of PCMCIA cards, the PCMCIA connector must define a space capable of receiving the 10.5 mm thickness of the type III card. Accordingly, space within the PCMCIA connector is not fully utilized when a type I or type II card is inserted therein. Thus, dirt and dust may enter the PCMCIA connector through the space.

Thus, it is desired to provide a PCMCIA connector comprising a dust shielding device in order to solve the above problem.

SUMMARY OF THE INVENTION

Accordingly, an object of the present invention is to provide a PCMCIA connector comprising a dust shielding member for protecting the connector from contamination caused by external dust and dirt when a type I or type II card is inserted therein.

Another object of the present invention is to provide a PCMCIA connector comprising a removable dummy card receivable therein for occupying unused space when a type I or type II card is inserted therein.

To achieve the above objects, a PCMCIA connector in accordance with the present invention comprises an insulative header retaining contact elements therein and a shielding casing having a top panel attached to the header. The shielding casing has two side panels extending from the top panel thereby defining a primary space adapted to receive a type I or type II PCMCIA card. A raised section is formed on the top panel and has a top wall located above the top panel. Two side walls extend from the top wall and are connected to the top panel for defining a secondary space in communication with and substantially continuous with the primary space whereby the primary and secondary spaces together can accommodate a type III PCMCIA card. A dummy card is selectively received in the secondary space without interfering with insertion of the type I or type II PCMCIA card into the primary space. The dummy card includes a flat body receivable in the secondary space and defines a recess in which a panel is pivotally supported for selectively shielding the primary and secondary spaces. The flat body has two resilient arms each forming a projection for engaging with a hole defined in a corresponding side wall of the raised section thereby retaining the dummy card in the secondary space.

BRIEF DESCRIPTION OF THE DRAWINGS

The present invention will be apparent to those skilled in the art by reading the following description of a preferred embodiment thereof, with reference to the accompanying drawings, in which.

Figure 1B:
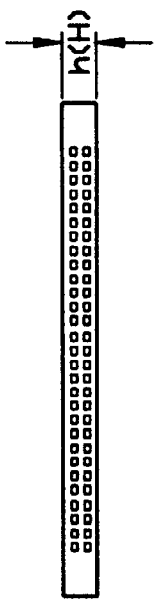
FIG. 1B is an end view of the type I PCMCIA card.
Figure 1A:
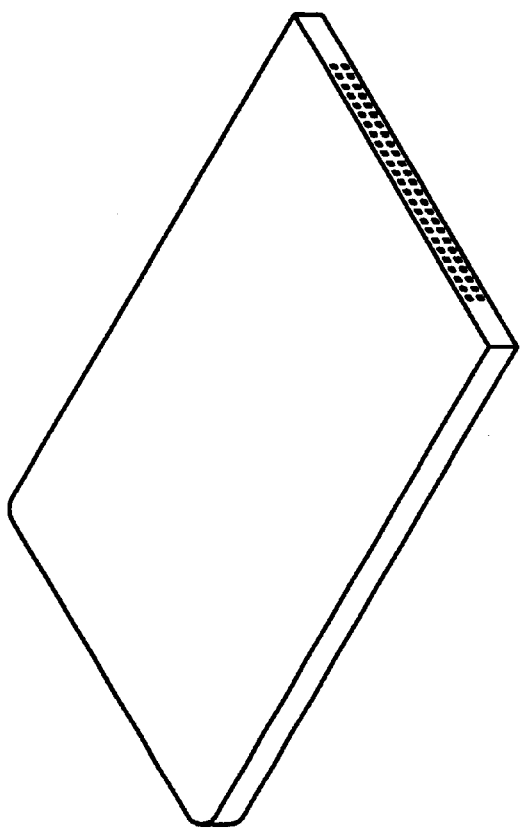
FIG. 1A is a perspective view of a type I PCMCIA card.
Figure 2B:
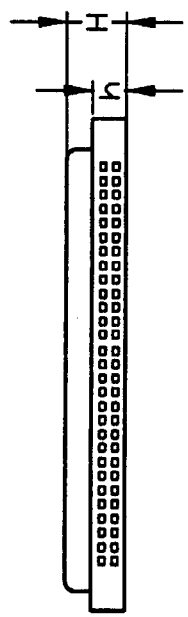
Figure 2A:
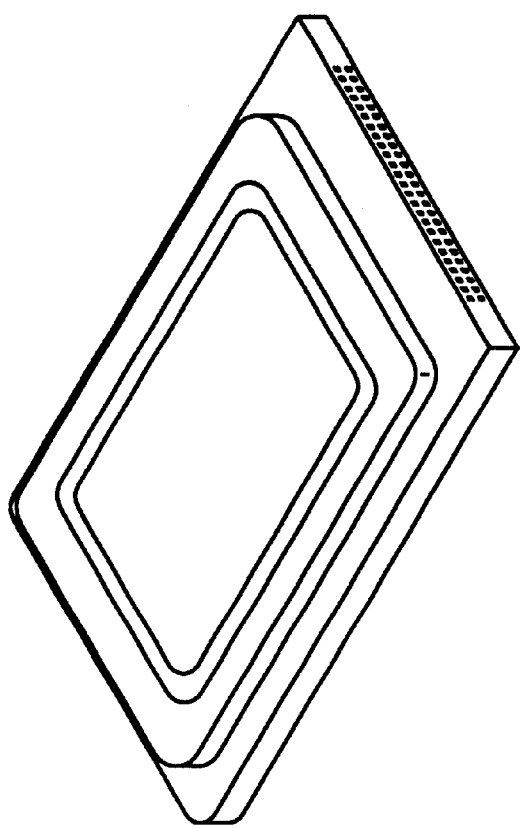
Figure 3B:
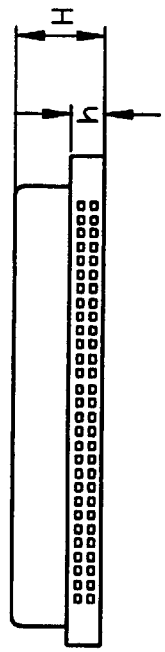
Figure 3A:
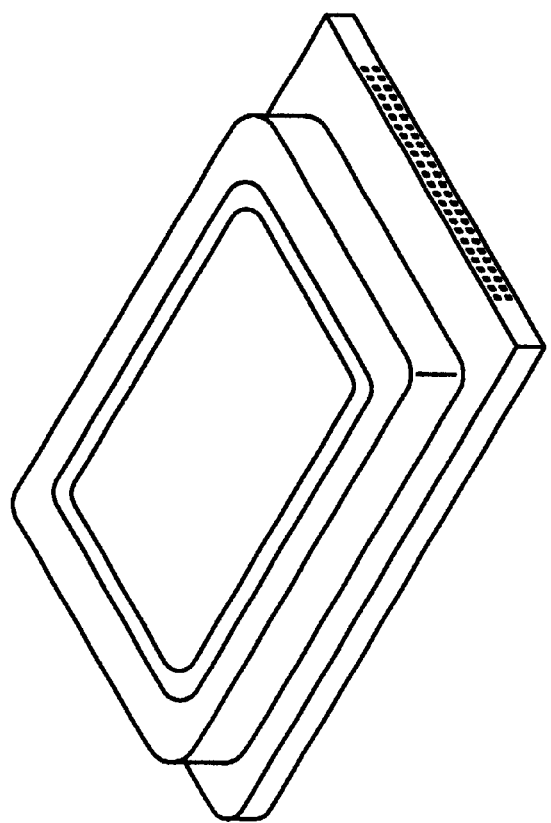
Figure 4:
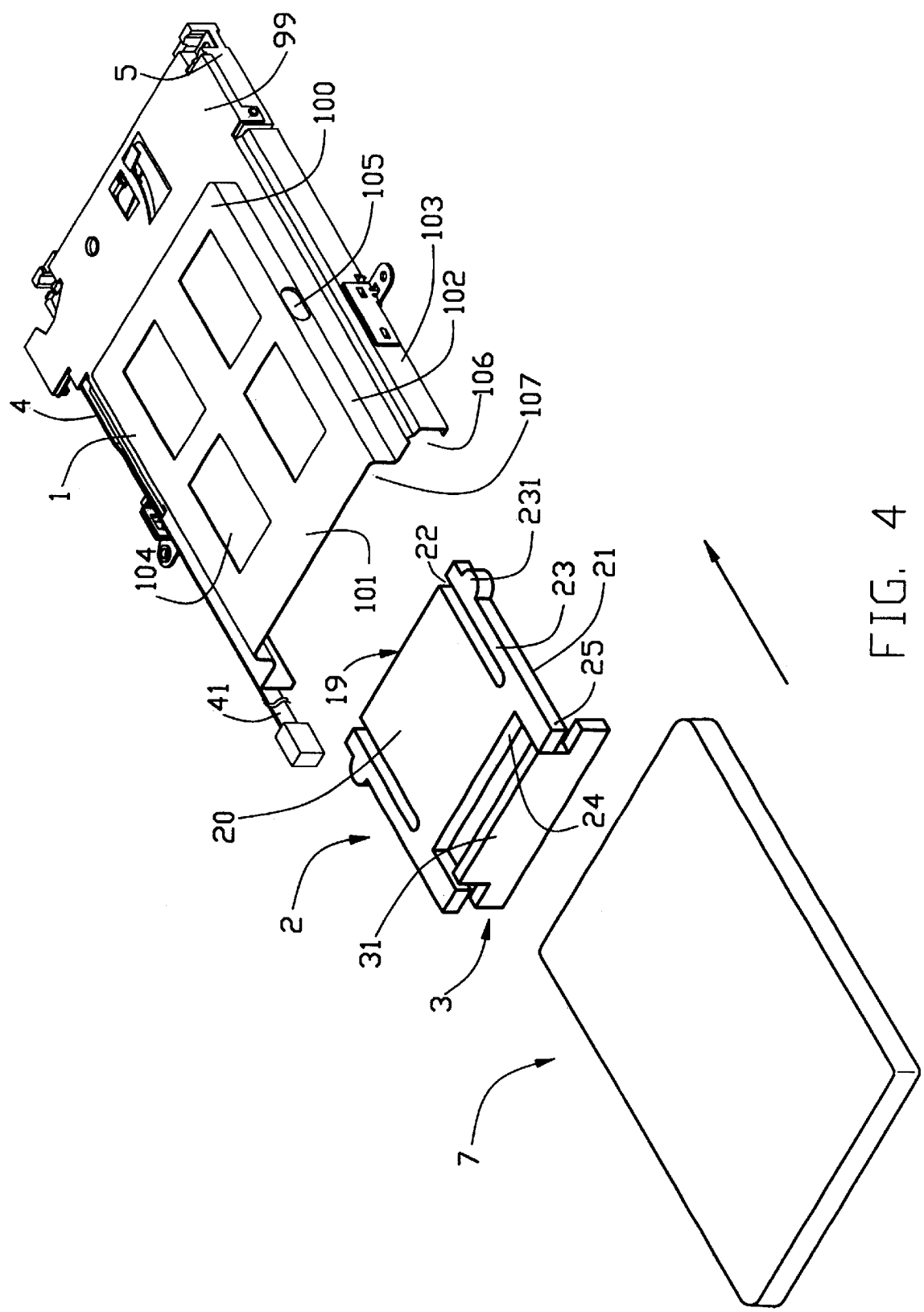
Figure 5:
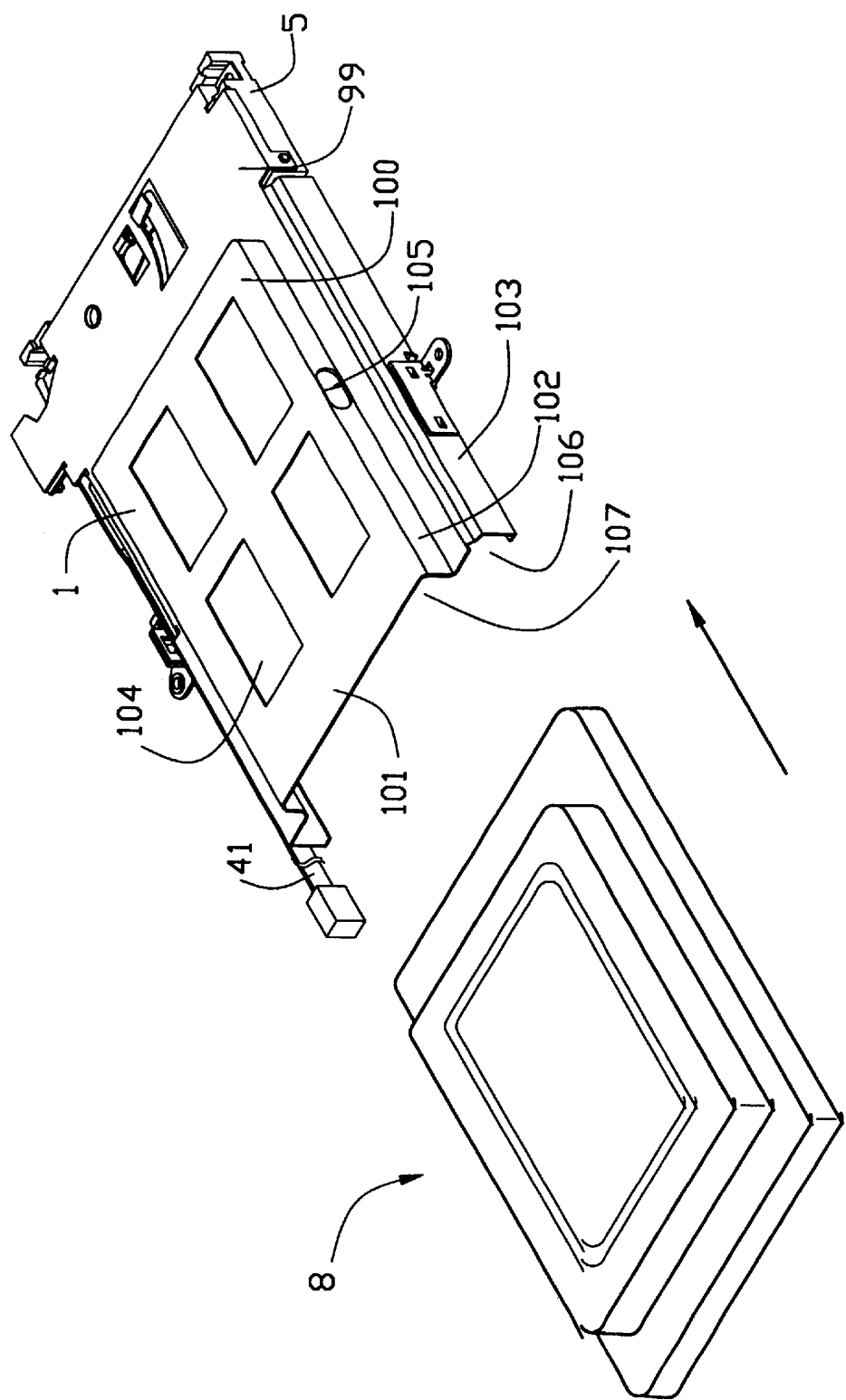
Figure 6:
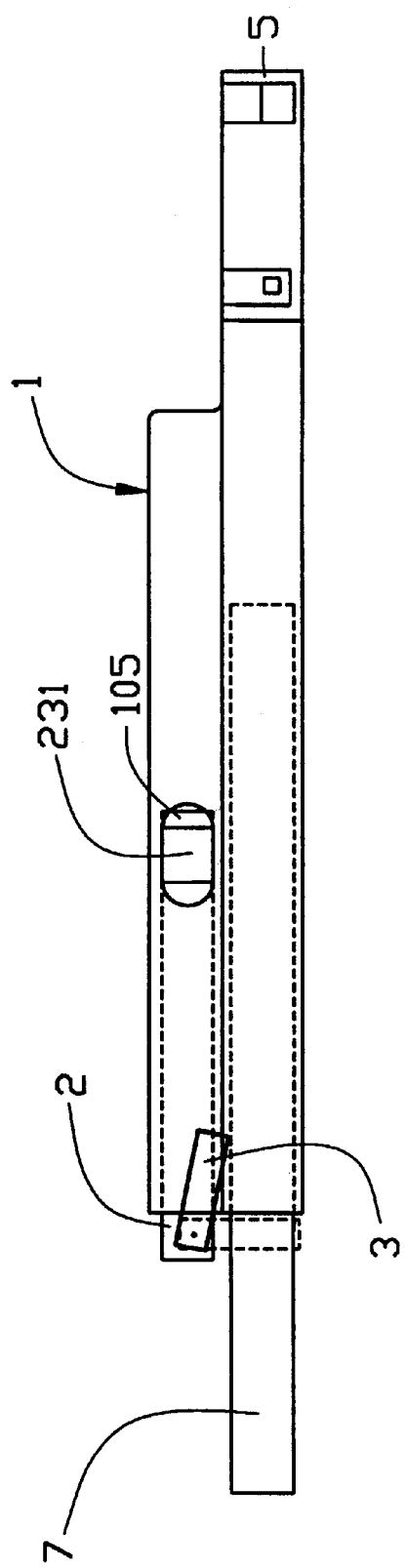
Figure 7:
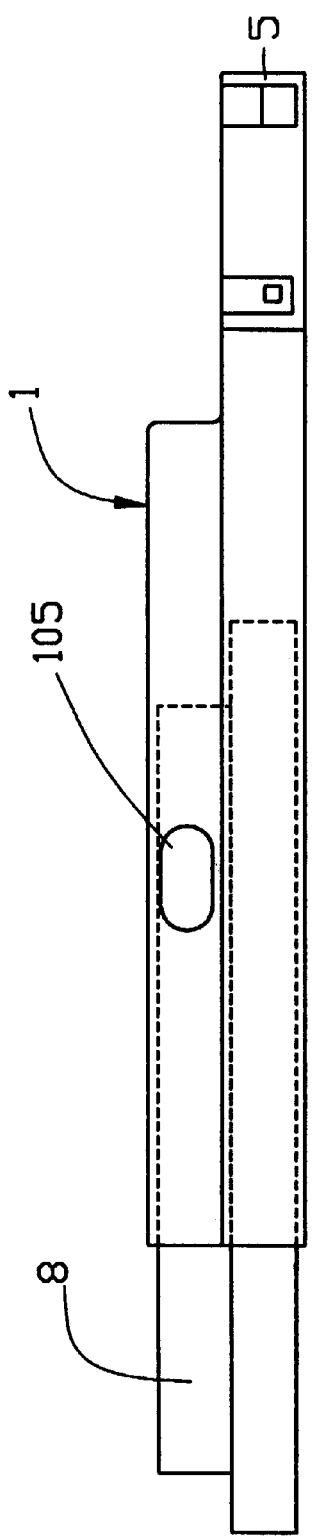

FYG. 2A is a perspective view of a type II PCMCIA card;

FIG. 2B is an end view of the type II PCMCIA card;

FIG. 3A is a perspective view of a type III PCMCIA card;

FIG. 3B is an end view of the type III PCMCIA card;

FIG. 4 is a perspective view of a PCMCIA connector constructed in accordance with the present invention showing a dummy card and a type I PCMCIA card to be inserted therein;

FIG. 5 is similar to FIG. 4 but showing a type III card to be inserted in the PCMCIA connector;

FIG. 6 is a side elevational view of the PCMCIA connector showing a dummy card and a type I card inserted therein; and FIG. 7 is a side elevational view of the PCMCIA connector showing a type III card inserted therein.

DETAILED DESCRIPTION OF THE PREFERRED EMBODIMENT

Referring to the drawings and in particular to FIG. 4, a Personal Computer Memory Card International Association (PCMCIA) connector in accordance with the present invention comprises an insulative header 5 retaining a plurality of contact elements (not shown) therein, and a shielding casing 1 attached to the header 5 and defining spaces for receiving a PCMCIA card 7 which is electrically engageable with the contact elements. A card release mechanism 4 including a release bar 41 is incorporated to release the PCMCIA card 7 from the connector by manually actuating the release bar 41.

The shielding casing 1 comprises a top panel 99 having an end portion attached to the header 5 and two side panels 103 extending from opposite edges thereof thereby defining a primary space 106 therebetween for accommodating a type I or type II PCMCIA card 7. Each side panel 103 forms a guide channel for guiding opposite edges (having a thickness of 3.3 mm) of the type I or type II PCMCIA card 7.

A raised section 101 is formed on the top panel 99 and has a top wall 100 located above the top panel 99. The raised section 101 has two side walls 102 extending from the top wall 100 thereby defining a secondary space 107 therebetween. The side walls 102 are connected to the top panel 99 whereby the secondary space 107 is in communication with and substantially continuous with the primary space 106 for accommodating a type III PCMCIA card 8 (FIG. 5). Openings 104 are defined in the top wall 100 of the raised section 101 for ventilation and heat dissipation purposes.

As shown in FIGS. 4 and 6, a dummy card 2 is selectively inserted into the secondary space 107 when a type I or type II PCMCIA card 7 is received in the primary space 106. The dummy card 2 comprises a flat body 19 receivable in the secondary space 107 with a top face 20 thereof facing the top wall 100 of the raised section 101 and a bottom face 21 facing the primary space 106. The flat body 19 has two resilient arms 23 formed on opposite sides thereof and distanced therefrom to form a space 22 for rendering the arm 23 to be resilient and deflectable. Each arm 23 forms a projection 231 proximate a free end thereof for engaging with a hole 105 defined in the corresponding side wall 102 of the raised section 101 thereby retaining the dummy card 2 in the secondary space 107. Preferably, the hole 105 is elongate for more securely retaining the dummy card 2.

The flat body 19 of the dummy card 2 defines a recess 24 in an outer edge thereof for receiving a panel 31 of a shielding door 3. The panel 31 is pivotally supported in the recess 24 by means of pivot pins 25 thereby rendering the panel 31 rotatable with respect to the flat body 19. The rotatability of the panel 31 allows a type I or type II PCMCIA card 7 to be inserted into/withdrawn from the primary space 106 without being interfered with by the panel 31. When a type I or type II PCMCIA card 7 is inserted into the primary space 106, the panel 31 is rotated to be positioned in the secondary space 107 with a lower edge thereof contacting the PCMCIA card 7 for preventing dirt or dust from entering into the connector. When the type I or type II PCMCIA card 7 is removed, the panel 31 is vertically positioned (as shown by phantom lines of FIG. 6) due to gravity which substantially closes the primary and second spaces 106, 107 and shields the connector from contamination due to dust and dirt.

As shown in FIGS. 5 and 7, when inserting a type III PCMCIA card 8 into the connector, the dummy card 2 is removed by being pulled outward to disengage the projections 231 of the arms 23 from the holes 105 whereby a substantially continuous space is formed by the primary and secondary spaces 106, 107 that is large enough to accommodate the type III PCMCIA card 8.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electronic card connector comprising:
    an insulative header;
    a shielding casing having a top panel attached to the header and two side panels extending from the top panel thereby defining a primary space adapted to receive a first electronic card having a first dimension, a raised section being formed on the top panel and having a top wall located above the top panel and two side walls extending from the top wall and connected to the top panel thereby defining a secondary space in communication with and substantially continuous with the primary space, the primary and secondary spaces together being adapted to accommodate a second electronic card of a second dimension; and
    a dust shielding device detachably received in the secondary space; wherein the dust shielding device comprises a flat body received in the secondary space, the flat body defining a recess in which a panel is pivotally supported, the panel assuming a vertical position to cover an entrance of the primary and secondary spaces opposite to the header.

2. The electronic card connector as claimed in claim 1, wherein the flat body comprises two resilient arms each having a projection detachably with a hole defined in a corresponding side wall of the raised section of the casing for retaining the flat body in the secondary space.

3. An electronic card connector for use with different thickness cards, comprising:
    one insulative header for use with only one card each time for the connector;
    a shielding casing positioned above the header, said shielding casing cooperating with said header to define a primary space coplanar with said header and further defining a secondary space communicatively above said primary space; and
    the connector is arranged for receivably mechanically and electrically engaging either one first type card having a smaller thickness generally occupying only the primary space, or one second type card having a larger thickness generally occupying both the primary space and the secondary space; wherein
    a dust shielding device is positioned adjacent one end of the shielding casing opposite to the header and covers entrances of both the primary and second spaces, and occupies only the secondary space so as not to prohibit the first type card from being inserted into the primary space.

4. An arrangement of an electronic card connector with first and second electrical cards, wherein said first electrical card and said second electrical card are mutually exclusively used within the connector and said second electrical card is thicker than the first electrical card, the electronic card connector comprising:
    at least one insulative header for use with at least one of said first and second electrical cards; and
    a shielding casing positioned above the header, said shielding casing cooperating with said header to define a primary space coplanar with said header and further define a secondary space communicatively above said primary space;
    a dust shielding device detachably disposed adjacent one end of the shielding device opposite to the header; wherein
    said dust shielding device covers entrances of both the primary and secondary spaces when no card is inserted into the connector and covers only the entrance of the secondary space when the first electrical card is inserted into the primary space, while is removed from the shielding casing when the second electrical card is inserted into both the primary and secondary spaces.

5. The arrangement as claimed in claim 4, wherein said dust shielding device removably occupies the secondary space.

* * * * *